United States Patent
Chen et al.

(10) Patent No.: US 9,683,119 B2
(45) Date of Patent: Jun. 20, 2017

(54) JET INK COMPOSITION, METHOD AND COATED ARTICLE

(71) Applicant: CORNING INCORPORATED, Corning, NY (US)

(72) Inventors: Tzu-Han Chen, Taichung (TW); Ruei-ming Huang, Tainan (TW); Yongsheng Yan, Fujian (CN)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 14/754,939

(22) Filed: Jun. 30, 2015

(65) Prior Publication Data

US 2016/0002479 A1 Jan. 7, 2016

Related U.S. Application Data

(60) Provisional application No. 62/020,455, filed on Jul. 3, 2014.

(51) Int. Cl.
*C09D 11/00* (2014.01)
*C09D 11/102* (2014.01)
(Continued)

(52) U.S. Cl.
CPC .......... *C09D 11/324* (2013.01); *C09D 11/102* (2013.01); *C09D 11/36* (2013.01);
(Continued)

(58) Field of Classification Search
CPC ....... C09D 11/00; C09D 11/102; C09D 11/36; C09D 11/324; H05K 1/09; H05K 3/1241; H05K 3/125
See application file for complete search history.

(56) References Cited

U.S. PATENT DOCUMENTS

| | | |
|---|---|---|
| 5,843,219 A | 12/1998 | Griffin et al. |
| 5,888,287 A | 3/1999 | Brown et al. |
| (Continued) | | |

FOREIGN PATENT DOCUMENTS

| | | |
|---|---|---|
| CA | 2286446 | 4/2001 |
| EP | 2290452 | 3/2011 |
| (Continued) | | |

OTHER PUBLICATIONS

Patent Cooperation Treaty International Notification of Transmittal of the International Search Report and the Written Opinion of the International Searching Authority, international application No. PCT/US2015/038426: mailing date Sep. 10, 2015, 9 pages.

*Primary Examiner* — Geoffrey Mruk
*Assistant Examiner* — Scott A Richmond
(74) *Attorney, Agent, or Firm* — John T. Haran (57) ABSTRACT

A jet ink composition, a jet ink coating method and a resulting jet ink coated article are all predicated upon the jet ink composition which includes in addition to a particulate pigment material and a solvent composition a resin composition. The resin composition includes an uncured silicone resin, an uncured epoxy resin and an uncured melamine resin. Upon thermal cure the uncured resin composition forms a cured resin composition with superior adhesion to substrates such as but not limited to glass substrates, ceramic substrates and metal oxide substrates.

12 Claims, 4 Drawing Sheets

(mainlib) 1,5,7,9,11,13-Hexamethyl-3, 15-divinyloctaprizmootasilasesquioxane (51) Int. Cl.
*C09D 11/324* (2014.01)
*G06F 1/16* (2006.01)
*C09D 11/36* (2014.01)
*H05K 3/12* (2006.01)
*H05K 1/09* (2006.01)

(52) U.S. Cl.
CPC ............... *G06F 1/16* (2013.01); *H05K 1/097* (2013.01); *H05K 3/125* (2013.01); *H05K 2201/0323* (2013.01); *H05K 2203/013* (2013.01)

(56) References Cited

U.S. PATENT DOCUMENTS

| | | | |
|---|---|---|---|
| 6,231,654 B1 | 5/2001 | Elwakil | |
| 6,309,452 B1 | 10/2001 | Beach et al. | |
| 6,730,149 B2 | 5/2004 | Arita et al. | |
| 6,827,772 B2 | 12/2004 | Foster | |
| 6,881,250 B2 | 4/2005 | Wong et al. | |
| 7,488,763 B2 | 2/2009 | Ushiku et al. | |
| 7,947,761 B2 | 5/2011 | Shakhnovich et al. | |
| 7,959,725 B2 | 6/2011 | Yamamoto et al. | |
| 8,251,503 B2 | 8/2012 | Kawashima | |
| 8,328,345 B2 | 12/2012 | Watanabe et al. | |
| 8,474,964 B2 | 7/2013 | Saito et al. | |
| 8,778,074 B2 | 7/2014 | Brown et al. | |
| 2004/0214920 A1 | 10/2004 | Aoshima | |
| 2005/0165135 A1 | 7/2005 | Mozel et al. | |
| 2011/0230603 A1 | 9/2011 | Yoda et al. | |
| 2012/0210908 A1 | 8/2012 | Endo et al. | |
| 2013/0089731 A1* | 4/2013 | Imanaka | B05D 7/14 428/336 |
| 2014/0135432 A1 | 5/2014 | Nishimoto et al. | |
| 2015/0014170 A1* | 1/2015 | Naisby | B01L 3/502707 204/600 |
| 2016/0207307 A1* | 7/2016 | De Mondt | B41M 5/0011 |

FOREIGN PATENT DOCUMENTS

| | | |
|---|---|---|
| JP | 2002204079 | 7/2002 |
| JP | 2009070677 | 4/2009 |
| JP | 2012201703 | 10/2012 |

\* cited by examiner

FIG. 1

(mainlib) 1,5,7,9,11,13-Hexamethyl-3,15-divinyloctaprizmootasilasesquioxane

| Typical BM Decoration Test | Corning Standard Criteria |
|---|---|
| Cross-Hatch Resistivity | 4B for BM to glass and BM to other inks |
| Electrical Resistivity | 1 cm probe separation, >200 M |
| High Temp Resistance | 250°C / 30 min & 3 hr, > 200 M |
| Thermal Cycle | 20-65°C / 25-90% RH / 12 hr, Cross-Hatch 4B |
| High Temp & Humidity | 25-65°C / 30-90% RH / 87 hr, Cross-Hatch 4B |
| Salty Water | 5% NaCl / 35°C / 72 hr, Cross - Hatch 4B |
| Chemical Resistance | Various consumer products, no discoloration |
| Thermal Shock | 20-65°C /100 Cycles, Snap tape pass |
| Snap Tape | Scotch brand cellulose tape |
| UV Exposure | Sankyo Denki 15W UV-B 72 hr, no discoloration |

JET INK COMPOSITION, METHOD AND COATED ARTICLE

CROSS-REFERENCE TO RELATED APPLICATIONS

This application claims the benefit of priority under 35 U.S.C. §119 of U.S. Provisional Application Ser. No. 62/020,455 filed on Jul. 3, 2014 the content of which is relied upon and incorporated herein by reference in its entirety.

BACKGROUND

Embodiments relate generally to jet ink compositions. More particularly embodiments relate to enhanced performance jet ink compositions, related methods and related coated articles.

Jet ink compositions that are used in jet ink printing processes are well known materials that often provide precise and reproducible images on porous substrates, such as but not limited to paper stock substrates. Unfortunately when applied to less porous substrates, such as but not limited to glass substrates, jet ink image adhesion and opacity are often compromised.

Thus, desirable are jet ink materials, jet ink coating processes and jet ink coated articles with enhanced properties, such as but not limited to enhanced glass substrate adhesion properties and enhanced opacity properties.

SUMMARY

Embodiments provide a jet ink composition, a method for coating and curing an article while using the jet ink composition and the resulting coated article that is coated with the cured jet ink composition.

Each of the foregoing jet ink composition, method for coating and curing the article while using the jet ink composition and coated article that is coated with the cured jet ink composition is predicated upon an uncured jet ink composition that comprises a pigment component, a resin composition and a solvent composition that ultimately provide the cured jet ink composition with enhanced adhesion and enhanced opacity with respect to a substrate surface (i.e., to provide the coated article), in particular under circumstances where the substrate surface comprises a glass surface, a ceramic surface, a metal oxide surface, a metal surface, or a polymeric surface.

In particular, an uncured resin composition within an uncured jet ink composition comprises an uncured silicone resin component (i.e., which in accord with further description below may alternatively be described as a silsesquioxane material component), an uncured epoxy resin component and an uncured melamine resin component.

And as well, a solvent composition within an uncured jet ink composition in accordance with the embodiments comprises: (1) propylene-glycol-monomethyl-ether; (2) diethylene-glycol-dimethyl-ether; and (3) propylene-glycol-methyl-ether-acetate.

A particular jet ink composition in accordance with the embodiments includes a pigment material. This particular jet ink composition also includes an uncured resin composition that further includes: (1) an uncured silicone resin component; (2) an uncured epoxy resin component; and (3) an uncured melamine resin component. This particular jet ink composition also includes a solvent composition that further includes: (1) propylene-glycol-monomethyl-ether; (2) diethylene-glycol-dimethyl-ether; and (3) propylene-glycol-methyl-ether-acetate.

A particular jet ink coating method in accordance with the embodiments includes coating upon a substrate an uncured jet ink composition including: (1) a pigment material; (2) an uncured resin composition including: (2a) an uncured silicone resin component; (2b) an uncured epoxy resin component; and (2c) an uncured melamine resin component; and (3) a solvent composition including: (3a) propylene-glycol-monomethyl-ether; (3b) diethylene-glycol-dimethyl ether; and (3c) propylene-glycol-methyl-ether-acetate. This particular jet ink coating method also includes curing in-situ the uncured jet ink composition upon the substrate to form a cured jet ink composition coating upon the substrate.

A particular jet ink coated article in accordance with the embodiments includes a substrate. This particular jet ink coated article also includes a cured coating located upon the substrate. The cured coating includes: (1) a pigment material; and (2) a cured resin binder composition binding the pigment material and comprising a cured silicone resin component, a cured epoxy resin component and a cured melamine resin component. In some embodiments, the particular jet ink coated article is incorporated into a consumer electronic product. The consumer electronic component can have a housing having a front surface, a back surface and side surfaces; electrical components provided at least partially internal to the housing, the electrical components including at least a controller, a memory, and a display, the display being provided at or adjacent the front surface of the housing; and the jet ink coated article of provided at or over the front surface of the housing such that it is provided over the display, In some embodiments, the consumer electronic product is a mobile phone, portable media player, notebook computer or tablet computer.

BRIEF DESCRIPTION OF THE DRAWINGS

The objects, features and advantages of the embodiments are understood within the context of the Detailed Description of the Non-Limiting Embodiments, as set forth below. The Detailed Description of the Non-Limiting Embodiments is understood within the context of the accompanying drawings, which form a material part of this disclosure, wherein.

DETAILED DESCRIPTION

Embodiments provide an uncured jet ink composition, a method for coating and curing an article while using the uncured jet ink composition and the coated article that is coated with the uncured jet ink composition and subsequently cured.

Each of the foregoing uncured jet ink composition, method for coating and curing the article while using the uncured jet ink composition and coated article that includes the cured jet ink composition is predicated upon an uncured jet ink composition that comprises a pigment component, an uncured resin composition and a solvent composition that ultimately provide the jet ink coated and cured article with enhanced adhesion and enhanced opacity with respect to the article surface, in particular under circumstances where the article surface comprises a glass surface, a ceramic surface or a metal oxide surface.

I. The Uncured Jet Ink Composition in Accordance with the Embodiments

A first of the primary components of an uncured jet ink composition in accordance with the embodiments is a pigment material that may comprise, but is not necessarily limited to, a carbon black particulate pigment material. Thus, in addition to a common black uncured jet ink composition, the embodiments also in general contemplate colored uncured jet ink compositions, in particular comprising a color or colors selected from the group including but not limited to red, green and blue, or alternatively from the group including but not limited to yellow, cyan and magenta. In general an uncured jet ink composition in accordance with the embodiments does not discriminate with respect to a color thereof, which is generally controlled by the color of the pigment material within the uncured jet ink composition.

A second of the primary components of an uncured jet ink composition in accordance with the embodiments is an uncured resin composition that includes, but is not necessarily limited to: (1) an uncured silicone resin component; (2) an uncured epoxy resin component; and (3) an uncured melamine resin component.

A third of the primary components of an uncured jet ink composition in accordance with the embodiments is a solvent composition that includes, but is not necessarily limited to: (1) propylene-glycol-monomethyl-ether; (2) diethylene-glycol-dimethyl-ether; and (3) propylene-glycol-methyl-ether-acetate.

Further details relating to the three primary components of an embodied uncured jet ink composition in accordance with the embodiments are as follows.

A pigment material (i.e., in particular a carbon black particulate pigment material) has a particle size from about 100 nanometers to about 150 nanometers and is present at about 3 to about 5 weight percent of the uncured jet ink composition. A suitable carbon black particulate pigment material for an uncured jet ink composition in accordance with the embodiments is generally commercially available. Several alternative commercially available sources of carbon black particulate pigment material are not precluded in accordance with the embodiments.

As is understood by a person skilled in the art, nanometer sized particulate pigment materials generally have a higher absorption rate of visible light in comparison with larger size particulate pigment materials, and may thus contribute to high optical density within a coated and cured jet ink composition in accordance with the embodiments, while maintaining a desirably low cured jet ink composition thickness. Nanometer sized carbon black particulate pigment materials also have an inhibited scattered reflection of visible light from the carbon black particulate pigment material surfaces, which increases the blackness of a coated and cured jet ink composition in accordance with the embodiments.

Figure 1:
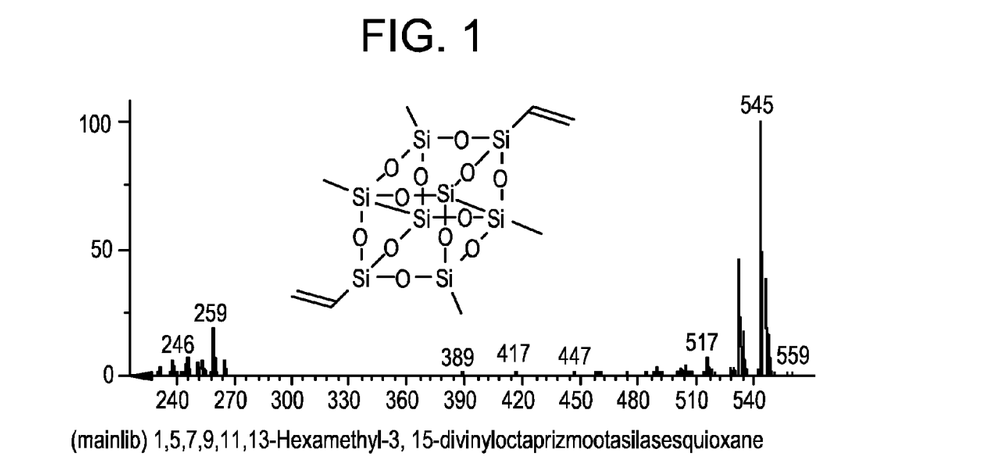
FIG. 1 shows a thermal desorption gas chromatogram mass spectroscopy (GC/MS) spectrum of an uncured jet ink composition in accordance with the embodiments.

An uncured silicone resin component within an uncured resin composition within an uncured jet ink composition in accordance with the embodiments comprises and may alternatively be defined as a silsesquioxane uncured silicone resin component, and more preferably (but not limited to) a divinyl-hexamethyl-octasila-silsesquioxane uncured silicone resin component (Vin2Me6Si8) whose chemical structure is illustrated in FIG. 1 along with a thermal desorption gas chromatography mass spectrum of the divinyl-hexamethyl-octasila-silsesquioxane uncured silicone resin component.

As is understood by a person skilled in the art, the Vin2Me6Si8 silsesquioxane uncured silicone resin component whose chemical structure is illustrated in FIG. 1 is a condensation product of 2 molecules of a vinyl-tri-substitutable silane and 6 molecules of a methyl-tri-substitutable silane. The tri-substitutable portions of the foregoing vinyl silane and methyl silane molecules may comprise, for example and without limitation, substitutable chemical functionality including but not limited to suitable halide functionality and suitable alkoxide functionality. Thus, suitable silane starting materials that may be used for preparing the silsesquioxane uncured silicone resin component whose chemical structure is illustrated in FIG. 1 may include, but are not limited to, vinyl-triethoxy-silane and methyl-trimethoxy-silane. The silsesquioxane uncured silicone resin component whose chemical structure is illustrated in FIG. 1 is present at about 15 to about 20 weight percent of an uncured jet ink composition in accordance with the embodiments. The silsesquioxane uncured silicone resin component whose chemical structure is illustrated in FIG. 1 is further characterized as a transparent viscous fluid having about 30% to about 45% solids, a viscosity from about 10 to about 20 centipoise at 25 C, a density from about 0.9 to about 1.0 gram/cm$^3$ at 23 C, and a surface tension from about 26 to about 29 dynes/cm.

A suitable uncured silicone resin component (i.e., including but not limited to the Vin2Me6Si8 silsesquioxane whose chemical structure is illustrated in FIG. 1) for use within an uncured resin composition within an uncured jet ink composition in accordance with the embodiments is available from any of several commercial sources as an appropriately designated uncured silicone resin. As noted above, the uncured silicone resin component may alternatively be prepared in-situ from reaction of an 1:3 ratio of an appropriate vinyl silane and an appropriate methyl silane.

An uncured epoxy resin component within an uncured resin composition within an uncured jet ink composition in accordance with the embodiments has a generally conventional molecular weight and is present at about 0.5 to about 3.0 weight percent of the uncured jet ink composition in accordance with the embodiments. Such an uncured epoxy resin component may derive from an uncured epoxy material selected from the group including but not limited to bisphenol (i.e., A and F) based uncured epoxy materials, novolak based uncured epoxy materials and aliphatic based uncured epoxy materials. A suitable but not limiting uncured epoxy resin component is further characterized as a slightly white transparent viscous liquid having a viscosity from about 2500 to about 4500 centipoise at 25 C, weight per epoxide (g/eq.) from about 160 to about 170, and a density from about 1.15 to about 1.20 g/cm$^3$ at 23 C.

Finally, an uncured melamine resin component within an uncured resin composition within an uncured jet ink composition in accordance with the embodiments has a generally conventional molecular weight and is present at about 1 to about 4 percent of the uncured jet ink composition in accordance with the embodiments. Such an uncured melamine resin component may derive from generally conventional uncured melamine resin materials. A suitable but not limiting uncured melamine resin component is characterized as a slightly yellow, transparent viscous fluid having a solid content from about 75 to about 85 percent, a viscosity from about 3000 to about 4000 centipoise 23 C, and a density from about 1.1 to about 1.5 g/cm$^3$ at 23 C.

The uncured resin composition of an uncured jet ink composition in accordance with the embodiments ensures adhesion of the particulate pigment material component (i.e., particularly a carbon black particulate pigment material component) to a substrate (i.e., particularly a glass substrate). Moreover, the uncured resin composition of an uncured jet ink composition assists when cured within the context of meeting or surpassing environmental reliability test criteria common with respect to a particular end application of a jet ink coated and cured substrate in accordance with the embodiments. The uncured resin composition of an uncured jet ink composition in accordance with the embodiments when cured may also ensure and provide additional functional attributes to a cured jet ink composition coated article, such as but not limited to solvent resistance and chemical resistance, and desirable electrical resistivity characteristics.

To that end, nanometer sized carbon black particulate pigment materials tend to be more electrically conductive than larger sized carbon black particulate pigment materials. Therefore, the uncured resin components within an uncured resin composition within an uncured jet ink composition in accordance with the embodiments are desirably able to fully encase the pigment material particles after curing, and prevent pigment material particle coagulation and resulting loss of electrical resistivity within a cured jet ink composition in accordance with the embodiments.

An uncured jet ink composition in accordance with the embodiments may be characterized as including a hybrid organic-inorganic resin composition. An inorganic uncured silicone resin component of an uncured resin composition of an uncured jet ink composition in accordance with the embodiments is desirably selected to provide adequate adhesion to a glass substrate surface, adequate hardness of a cured jet ink coating and adequate dimensional stability after high temperature bake (up to about 250-280 C). An uncured epoxy resin component of an uncured resin composition within an uncured jet ink composition in accordance with the embodiments provides resistance to alkali detergents that may be used in cleaning the cured jet ink composition coating after curing. An uncured melamine resin component of an uncured jet ink resin composition within an uncured jet ink composition in accordance with the embodiments is intended to provide adequate solvent and chemical resistance, and electrical resistivity of the cured jet ink composition after coating.

Thus, in accordance with the foregoing an uncured resin composition within an uncured jet ink composition in accordance with the embodiments is coated upon a substrate using otherwise standard jet ink coating apparatus and then desirably thermally cured at 150-200 C for greater than 10 min (i.e., presuming that the curing is undertaken in a convection oven; shorter cure times may be accessible when using an infrared oven).

Beyond the uncured silicone resin component, the uncured epoxy resin component and the uncured melamine resin component which are generally intended as thermosetting resin components, the embodiments also contemplate addition of other resin components which may as appropriate be thermosetting resin components or thermoplastic resin components, to achieve specific materials properties. Such thermoplastic resin components may include but are not limited to acrylic resin components and olefinic resin components.

With respect to the solvent composition within an uncured jet ink composition in accordance with the embodiments: (1) propylene-glycol-monomethyl-ether is present at about 30 to about 40 weight percent; (2) diethylene-glycol-dimethyl-ether is present at about 10 to about 13 weight percent; and (3) propylene-glycol-methyl-ether-acetate is present at about 10 to about 12 weight percent. The three foregoing glycol solvents are regarded as generally conventional solvents that require no additional specification and are readily sourced from any of several suppliers at an appropriate purity level for use within an uncured jet ink composition in accordance with the embodiments. Moreover, it is anticipated that the solvent composition within an uncured jet ink composition in accordance with the embodiments may be characterized using a gas chromatography analysis at 200 C.

In general in accordance with the embodiments, the solvent materials are selected to serve as a carrier for the pigment material particles and in particular the carbon black pigment material particles, enabling the pigment material particles to be uniformly and smoothly ejected from a jet ink print head onto a non-porous substrate, such as but not limited to a glass substrate, a ceramic substrate or a metal oxide substrate. In addition, the foregoing three solvent components also control the drying, fluidic and wetting properties of the uncured jet ink composition, as well as ensuring that the uncured jet ink composition viscosity and surface tension does not change with temperature, and thus maintains stable printing performance (e.g., infrequent clogging of print head nozzles).

Beyond the foregoing primary components including the pigment component, the resin composition and the solvent composition, an uncured jet ink composition in accordance with the embodiments may also further comprise specific additives that may be otherwise conventional or unconventional within the context of uncured jet ink compositions. Such additional additives may include, but are not necessarily limited to: (1) a dispersant that may be present at about 1.5 to about 3.5 weight percent and comprise a polyurethane and polymethylmethacrylate copolymer material; (2) a flow promoter that may be present at about 0.5 to about 1 weight percent and comprise a polyether modified poly-dimethyl-siloxane material; and (3) a resin strengthener that may be present up to about 3 percent and comprise a conventional composition.

A flow promoter additive in particular improves the wetting of the uncured jet ink composition onto a glass substrate, a ceramic substrate or a metal oxide substrate, thus preventing de-wetting of the uncured jet ink composition from a substrate prior to curing. A flow promoter that may be used within the context of an uncured jet ink composition in accordance with the embodiments is generally commercially available.

On the other hand, a dispersant is intended to keep the pigment material component particles uniformly suspended even after being mixed into a paste and an uncured jet ink composition, and prevent coagulation or sedimentation. Coagulated pigment material component particles may clog jet ink nozzles, cause point defects when printed onto substrates and dramatically reduce electrical resistivity of a cured jet ink composition. Nanometer sized pigment material component particles are more susceptible to coagulation in comparison with larger sized pigment material component particles, due to stronger van der Waal forces.

As noted above, a particular dispersant material uses a high molecular weight polyurethane and poly-methyl-methacrylate co-polymer material. This type of dispersant may have many anchor groups in the copolymer molecule to attach to pigment material particle surfaces, and thus surround a pigment material particle. The dispersant material co-polymer material molecules also have long polymer chains that provide interstitial space for the uncured resin components and the solvent materials in the uncured jet ink composition. A co-polymer dispersant as described above must be compatible with an uncured resin composition and a solvent composition in accordance with the embodiments to ensure that the dispersant is fully dissolved, and that the dispersant polymer chains are fully extended. Such a full extension of dispersant polymer chains overcomes the van der Waals forces that attract the pigment material particles to each other, and ensures that pigment material particles do not coagulate either while in an uncured jet ink composition solution or after curing into a cured jet ink composition coating. A polyurethane and polymethylmethacrylate copolymer dispersant that is suitable for compatibility with an uncured resin composition in accordance with the embodiments is commercially available.

An uncured jet ink composition in accordance with the embodiments may be prepared by mixing the foregoing components in any order, until a uniform suspension of the uncured jet ink composition is obtained. Typically and preferably, the sum of the components is mixed and appropriately adjusted to provide an uncured jet ink composition that has a viscosity from about 4 to about 6 centipoise at 25 degrees Celsius.

Figure 2:
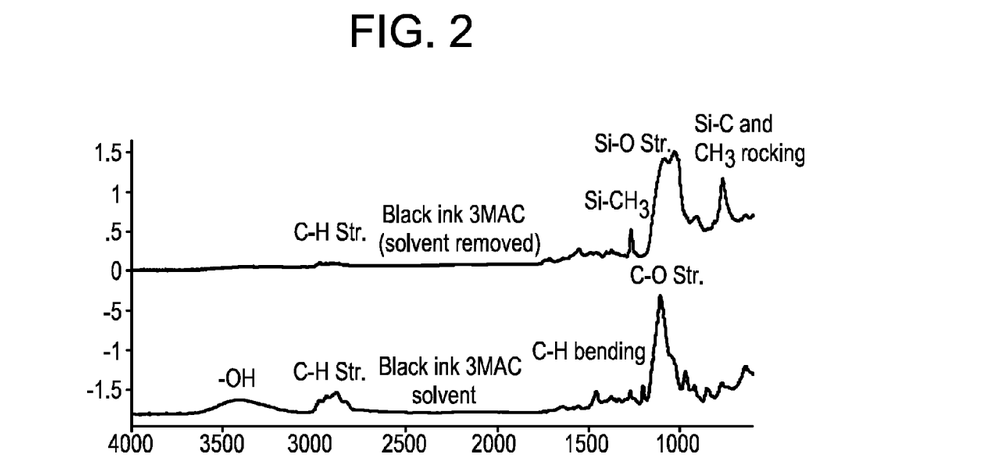
FIG. 2 shows a Fourier transform infrared (FTIR) spectrum of an uncured jet ink composition in accordance with the embodiments, with and without solvent composition.

For reference purposes a Fourier transform infrared spectrum of an uncured jet ink composition in accordance with the embodiments is shown in FIG. 2, with and without solvent.

For reference purposes both a positive ionization electrospray ionization mass spectrum (FIG. 3*a*) and a negative ionization electrospray ionization mass spectrum (FIG. 3*b*) are also provided for an uncured jet ink composition in accordance with the embodiments.

Figure 3A:
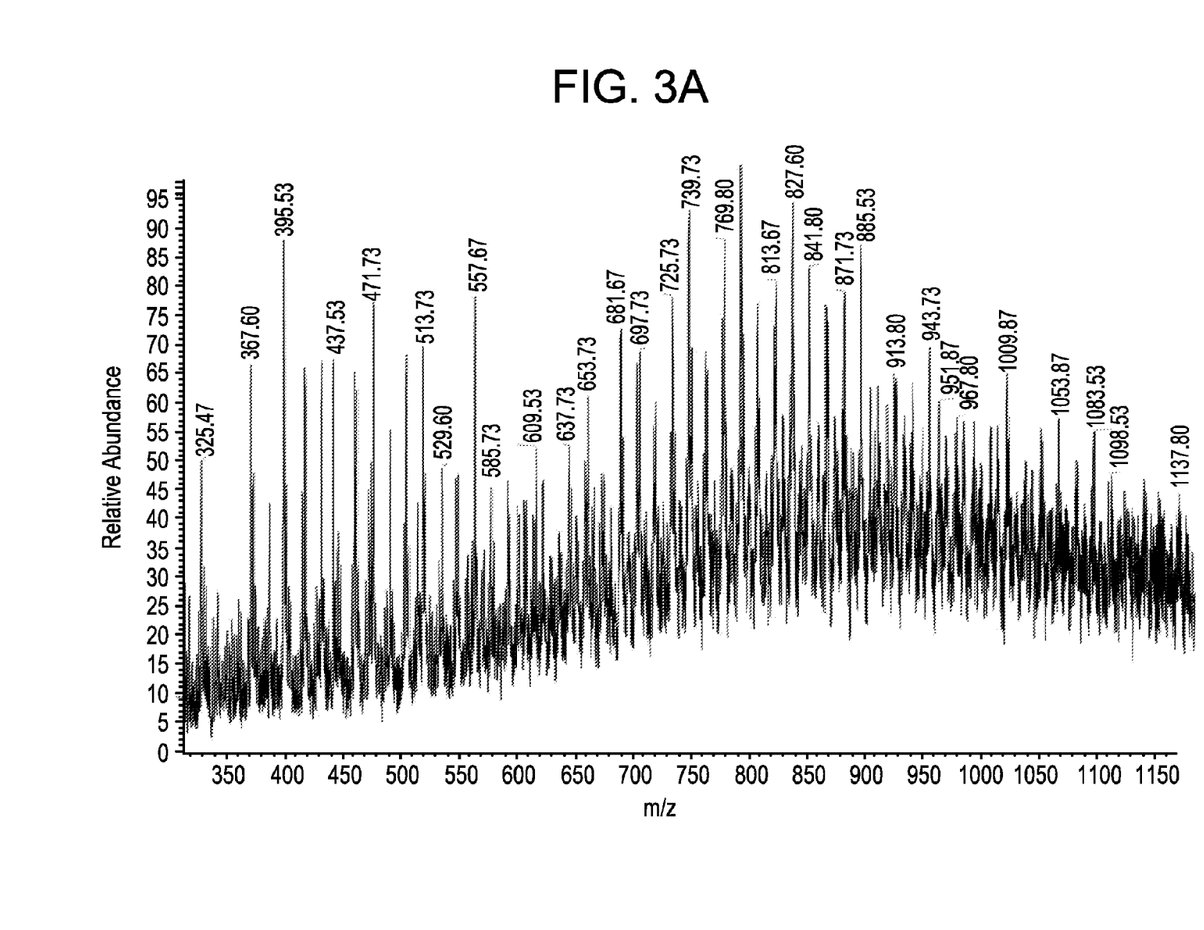
FIG. 3a shows a positive ionization electrospray mass spectrum for an uncured jet ink composition in accordance with the embodiments.

The positive ionization electrospray ionization mass spectrum confirms an identity of a flow promoter additive as a polyethylene-oxide-co-polydimethyl-siloxane copolymer. A random spacing of 44 Da (ethoxy) and 74 Da is typical of ethylene-oxide-co-dimethyl-siloxane copolymers, as is the observed isotopic distribution. The major distribution within the mass spectrum has an approximate average molecular weight of 800 Da. A lesser distribution within the mass spectrum has an average molecular weight of 450 Da.

Figure 3B:
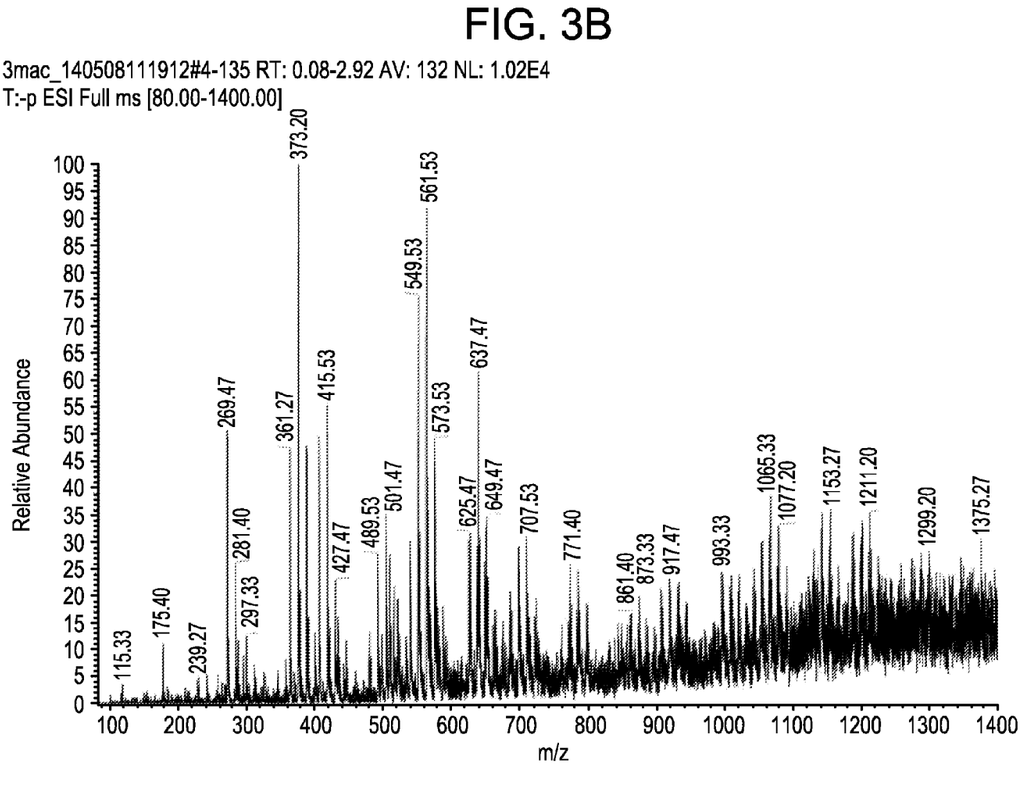
FIG. 3b shows a negative ionization electrospray mass spectrum for an uncured jet ink composition in accordance with the embodiments.

The negative ionization electrospray ionization mass spectrum confirms the presence of a series methyl and vinyl-functional silsesquioxanes. In that regard, the mass spacing within each series of 12 Da is typical of the R-group substitution of one methyl group for one vinyl group sequentially. The isotopic distribution is typical of number of silicon atoms in the appropriate mass range corresponding to T6, T8, etc.

II. The Jet Ink Composition Coating Method in Accordance with the Embodiments

A jet ink coating method in accordance with the embodiments parallels generally the jet ink composition in accordance with the above description. Thus, one first coats upon a substrate an uncured jet ink composition comprising: (1) a carbon black (or alternatively colored) pigment material; (2) an uncured resin composition comprising: (2a) an uncured silicone resin component; (2b) an uncured epoxy resin component; and (2c); an uncured melamine resin component (2c); and (3) a solvent composition comprising: (3a) propylene-glycol-monomethyl-ether; (3b) diethylene-glycol-dimethyl-ether; and (3c) propylene-glycol-methyl-ether-acetate. One next cures in-situ the uncured jet ink composition upon the substrate to form a cured jet ink composition coating upon the substrate.

Within the embodiments the uncured jet ink composition is preferably thermally cured to form the cured jet ink composition coating. Such thermal curing of the uncured jet ink composition to provide the cured jet ink composition coating is typically undertaken at a temperature from about 160 to about 250 degrees centigrade, and for a time period from about 1 to about 20 minutes, in an inert atmosphere. Such curing conditions may also depend on whether one uses a convection oven or an infrared oven.

Consistent with aspects of the embodiments as discussed above, an uncured jet ink composition in accordance with the embodiments is coated and cured upon a substrate selected from the group including but not limited to a glass substrate, a ceramic substrate and a metal oxide substrate. Particular end product applications of such substrates are varied.

The foregoing substrate selection options and uncured jet ink composition coating and thermal processing curing conditions are not intended to limit the embodiments with respect to any particular functional end result. Rather, the embodiments intend and expect that alternative thermal processing curing conditions may be accessed to realize specific thermally cured jet ink composition coated substrates.

III. The Cured Jet Ink Composition Coated Article in Accordance with the Embodiments Following in sequence from the foregoing uncured jet ink composition and method for coating the foregoing jet ink composition to provide a cured jet ink composition coated article, is the cured jet ink composition coated article itself.

Such a cured jet ink coated article includes a substrate as well as the cured jet ink composition coating located upon the substrate. The cured coating includes a pigment. The cured coating also includes a cured resin binder composition that further includes a cured silicone resin component, a cured epoxy resin component and a cured melamine resin component.

Desirably, within a coated article in accordance with the embodiments the substrate is selected from the group consisting of a glass substrate, a ceramic substrate and a metal oxide substrate.

Desirably, a cured coating in accordance with the embodiments has a thickness from about 2 to about 6 microns.

Desirably, the coated article in accordance with the embodiments exhibits an adhesion of the cured coating to the substrate that is greater than or equal to 4 B on a cross hatch adhesion test described as standard test method.

Desirably the cured coating in accordance with the embodiments has an optical density from about 3 to about 5.5.

Desirably within the cured coating in accordance with the embodiments the pigment component particles are regularly arranged.

Finally, the cured jet ink resin composition within the cured coated article in accordance with the embodiments may be chemically characterized using standard methodology.

In some embodiments the ink jet coated article can be incorporated into a consumer electronic device. In some embodiments, the consumer electronic component can have a housing having a front surface, a back surface and side surfaces; electrical components provided at least partially internal to the housing, the electrical components including at least a controller, a memory, and a display, the display being provided at or adjacent the front surface of the housing; and the jet ink coated article of provided at or over the front surface of the housing such that it is provided over the display. In some embodiments, the consumer electronic product is a mobile phone, portable media player, notebook computer or tablet computer.

IV. Experimental

Figure 4:
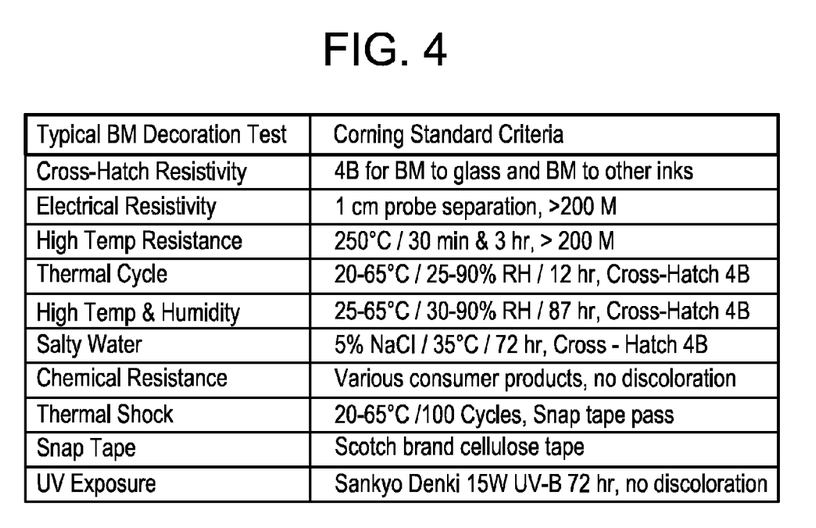
FIG. 4 shows a tabulation of experimentally determined properties and functional test criteria fulfilled by a cured jet ink composition coated upon a cover lens substrate in accordance with the embodiments.

For reference purposes, a tabulation of functional performance characteristic requirements of a cured jet ink composition coated upon a glass substrate is shown in FIG. 4. A cured jet ink composition coated upon a glass substrate in accordance with the embodiments fulfills all of the tabulated functional performance characteristic requirements.

It will be apparent to those skilled in the art that various modifications and variations can be made without departing from the spirit or scope of the claims.

What is claimed is:

1. An ink composition comprising:
   a pigment material;
   an uncured resin composition comprising:
     an uncured silicone resin component;
     an uncured epoxy resin component; and
     an uncured melamine resin component; and
   a solvent composition comprising:
     propylene-glycol-monomethyl-ether;
     diethylene-glycol-dimethyl-ether; and
     propylene-glycol-methyl-ether-acetate.

2. The ink composition of claim 1 wherein:
   the pigment material comprises a carbon black particulate pigment material present at about 3 to about 5 weight percent;
   the uncured resin composition comprises:
     the uncured silicone resin which comprises a silsesquioxane component present at about 15 to about 20 weight percent;
     the uncured epoxy resin component present at about 0.5 to about 3 weight percent; and
     the uncured melamine resin component present at about 1 to about 4 weight percent; and
   the solvent composition comprises:
     propylene-glycol-monomethyl-ether present at about 30 to about 40 weight percent;
     diethylene-glycol-dimethyl-ether present at about 10 to about 13 weight percent; and
     propylene-glycol-methyl-ether-acetate present at about 10 to about 12 weight percent.

3. The ink composition of claim 1 further comprising an additive composition.

4. The ink composition of claim 3 wherein the additive composition comprises at least one of:
   a dispersant present at about 1.5 to about 3.5 weight percent;
   a flow promoter present at about 0.5 to about 1 weight percent; and
   a resin strengthener present at up to about 3 percent.

5. The ink composition of claim 4 wherein the ink composition has a viscosity from about 4 to about 6 centipoise at about 25 degrees Celsius.

6. The ink composition of claim 2 wherein the carbon black particulate pigment material has a particle size from about 100 to about 150 nanometers.

7. An ink coating method comprising:
   coating upon a substrate an uncured jet ink composition comprising:
     a pigment material;
     an uncured resin composition comprising:
       an uncured silicone resin component;
       an uncured epoxy resin component; and
       an uncured melamine resin component; and
     a solvent composition comprising:
       propylene-glycol-monomethyl-ether;
       diethylene-glycol-dimethyl ether; and
       propylene-glycol-methyl-ether-acetate; and
   curing in-situ the uncured jet ink composition upon the substrate to form a cured ink composition upon the substrate.

8. The method of claim 7 wherein the uncured jet ink composition is thermally cured to form the cured ink composition.

9. The method of claim 8 wherein the uncured ink composition is thermally cured at:
   a temperature from about 160 to about 250 degrees centigrade; and
   a time period from about 1 to about 20 minutes, in an inert atmosphere.

10. The method of claim 7 wherein the substrate is selected from the group consisting of a glass substrate, a ceramic substrate, a metal oxide substrate, a metal substrate, and a polymeric substrate.

11. The method of claims 7, wherein the pigment material comprises a carbon black particulate.

12. The method of claim 7, wherein:
   the pigment material comprise a carbon black particulate pigment material present at about 3 to about 5 weight percent;
   the uncured resin composition comprise:
     the uncured silicone resin which comprises a silsesquioxane component present at about 15 to about 20 weight percent;
     the uncured epoxy resin component present at about 0.5 to about 3 weight percent; and
     the uncured melamine resin component present at about 1 to about 4 weight percent; and
   the solvent composition comprises:
     propylene-glycol-monomethyl-ether present at about 30 to about 40 weight percent;
     diethylene-glycol-dimethyl-ether present at about 10 to about 13 weight percent; and
     propylene-glycol-methyl-ether-acetate present at about 10 to about 12 weight percent.

* * * * *